(12) United States Patent
Sharifipour

(10) Patent No.: US 10,742,030 B2
(45) Date of Patent: Aug. 11, 2020

(54) DYNAMIC LOAD BALANCING

(71) Applicant: KATERRA INC., Menlo Park, CA (US)

(72) Inventor: Bahman Sharifipour, Newington, NH (US)

(73) Assignee: KATERRA INC., Menlo Park, CA (US)

( * ) Notice: Subject to any disclaimer, the term of this patent is extended or adjusted under 35 U.S.C. 154(b) by 37 days.

(21) Appl. No.: 15/870,846

(22) Filed: Jan. 12, 2018

(65) Prior Publication Data
US 2019/0222023 A1  Jul. 18, 2019

(51) Int. Cl.
| | |
|---|---|
| H02J 3/14 | (2006.01) |
| G05F 1/66 | (2006.01) |
| H02J 3/38 | (2006.01) |
| G01R 19/25 | (2006.01) |
| H02J 13/00 | (2006.01) |
| H02J 3/00 | (2006.01) |
| G05B 15/02 | (2006.01) |
| G01R 21/133 | (2006.01) |
| H02J 3/26 | (2006.01) |

(52) U.S. Cl.
CPC ............ *H02J 3/14* (2013.01); *G01R 19/2513* (2013.01); *G05F 1/66* (2013.01); *H02J 3/38* (2013.01); *H02J 13/0017* (2013.01); *G05B 15/02* (2013.01); *H02J 3/003* (2020.01)

(58) Field of Classification Search
CPC .. H02J 3/14; H02J 3/38; H02J 13/0017; H02J 2003/003; G01R 19/2513; G05F 1/66; G05B 15/02
See application file for complete search history.

(56) References Cited

U.S. PATENT DOCUMENTS

| | | | | |
|---|---|---|---|---|
| 6,018,203 | A * | 1/2000 | David | H02J 3/14 307/52 |
| 2012/0316691 | A1* | 12/2012 | Boardman | H02J 3/26 700/293 |
| 2014/0058577 | A1* | 2/2014 | Erhart | G05F 1/66 700/297 |
| 2017/0346292 | A1* | 11/2017 | Handelsman | H02J 3/14 |
| 2017/0353030 | A1* | 12/2017 | Al Jabri | H02J 3/005 |
| 2018/0287541 | A1* | 10/2018 | Wang | H02P 23/28 |

* cited by examiner

*Primary Examiner* — Thomas C Lee
*Assistant Examiner* — Anzuman Sharmin
(74) *Attorney, Agent, or Firm* — Maschoff Brennan

(57) ABSTRACT

Various embodiments relate to power distribution systems. A power distribution system may include a switching unit configured to receive power from a plurality of sources, each source of the plurality of sources configured to supply power at a phase offset from a phase of every other source. The power distribution system may also include a plurality of loads. Furthermore, the power distribution system may include at least one monitoring unit configured to selectively couple, via the switching unit, each load of the plurality of loads to a source of the plurality of sources based on at least one of a current power demand of the plurality of loads and a predicted demand of the plurality of loads.

10 Claims, 6 Drawing Sheets

DYNAMIC LOAD BALANCING

FIELD

The embodiments discussed herein relate to load balancing in power distribution systems.

BACKGROUND

Electricity may be delivered to electricity consumers via an electrical grid, which may produce power in one or more phases (e.g., 1-phase, 2-phases, 3-phases, etc.). An electrical load, which consumes electricity, may vary based on, for example, demands of one or more consumers. Load balancing in multi-phase power distributions systems has proven to be challenging.

The subject matter claimed herein is not limited to embodiments that solve any disadvantages or that operate only in environments such as those described above. Rather, this background is only provided to illustrate one example technology area where some embodiments described herein may be practiced.

SUMMARY

One or more embodiments of the present disclosure may include a power distribution system. For example, a power distribution system may include a switching unit configured to receive power from a plurality of sources, wherein each source of the plurality of sources may be configured to supply power at a phase offset from a phase of every other source. In some embodiments, the plurality of sources includes three sources configured to transmit power at three phases, each separate by 120 degrees. The power distribution system may also include a plurality of loads. Furthermore, the power distribution system may include at least one monitoring unit configured to selectively couple, via the switching unit, each load of the plurality of loads to a source of the plurality of sources based on at least one of a current power demand of the plurality of loads and a predicted power demand of the plurality of loads. In some embodiments, the power distribution system includes a master monitoring unit and one or more metering units or slave monitoring units.

According to other embodiments, the present disclosure includes methods for supplying electrical power to a plurality of loads. Various embodiments of such a method may include supplying power at a first phase to at least a first load of a plurality of loads. The method may also include supplying power at a second phase, offset from the first phase, to at least a second load of the plurality of loads. Further, the method may include supplying power at one of the second phase and a third phase, offset from each of the first phase and second phase, to the at least a first load based on at least one of a detected change in the current power demand of one or more loads of the plurality of loads and a predicted power demand of the one or more loads.

Further, other embodiments may include non-transitory computer-readable media having computer instructions stored thereon that, in response to being executed by a processing device of a system, cause the system to perform or control performance various operations described herein.

The object and advantages of the embodiments will be realized and achieved at least by the elements, features, and combinations particularly pointed out in the claims. Both the foregoing general description and the following detailed description are exemplary and explanatory and are not restrictive.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

In multiphase power distribution networks, each phase may supply one or more electrical loads. Typically, during design and/or construction of conventional power distribution systems, it is determined which loads (e.g., circuit and/or components) are connect to which incoming phases. However, due to continuous changes in power consumption of the loads and/or power demands within the system, and the static nature of power distribution systems, distributing an electrical load evenly across a multiphase distribution network has proven to be challenging. In unbalanced systems, undesirable neutrals currents may result in decreased power efficiency and/or may result in a need for larger gauge neutral wires.

Various embodiments disclosed herein relate to load balancing, and more specifically, dynamic load balancing in multiphase power distribution systems. In contrast to conventional static power distribution systems, dynamic power distribution systems may be configured to dynamically adjust one or more connections between one or more loads and one or more sources based on power demands (e.g., detected and/or predicted power demands) of the one or more loads.

Embodiments of the present disclosure are now explained with reference to the accompanying drawings.

Figure 1:
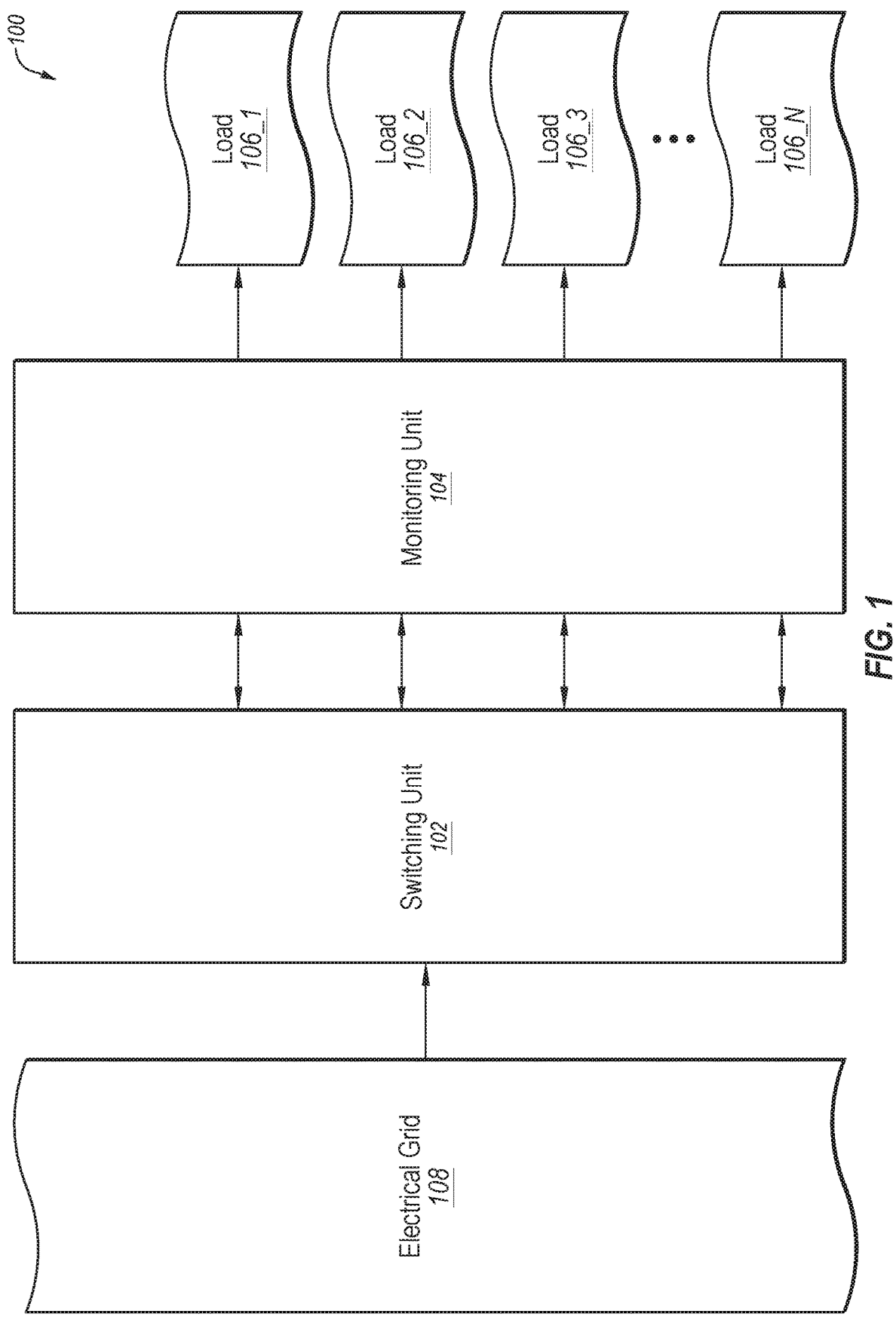
FIG. 1 depicts an example power distribution system.

FIG. 1 depicts an example power distribution system, according to one or more embodiments of the present disclosure. Power distribution system 100, which may also be referred to herein as a "power supply system," includes a switching unit 102, a monitoring unit 104, and a plurality of loads 106 (e.g., loads 106_1-106_N). Further, in at least some embodiments, switching unit 102 may be coupled to an electrical grid 108. Electrical grid 108, which may be configured for delivering power to consumers, may include, for example a power generator (e.g., power station) and/or one or more transmission and/or distribution lines. In some embodiments, a metering unit may be coupled between electrical grid 108 and phase switching unit 102.

Monitoring units 104 may also be referred to herein as "control units" or "monitor and control units." According to various embodiments, monitoring unit 104, which may include one or more monitoring units and/or metering units, may be configured to measure power, voltage, current, phase, power factor, or any combination thereof, delivered to one or more loads. Further, monitoring unit 104 may be configured to dynamically adjust one or more connections between sources (e.g., multiphase sources) of electrical grid 108 and loads 106.

In some embodiments, the one or more connections between the sources and the loads 106 may be adjusted to more evenly distribute a total load across the sources. More specifically, for example, one or more monitoring units 104 may detect or predict a change in power consumption of one or more loads, and, in response thereto, dynamically adjust one or more connections between the sources and the loads to more evenly distribute a total load across the phases (e.g., three phases) generated by the sources of electrical grid 108.

As described more fully herein, in some embodiments, monitoring unit 104 may include a master monitoring unit and one or more metering units (also referred to herein as "slave monitoring units") (e.g., one metering unit for each load). Further, in some embodiments, monitoring unit 104 may include a plurality of monitoring units (e.g., one monitoring unit for each load), wherein one monitoring unit may function as a master monitoring unit. In other embodiments, monitoring unit 104 may include a plurality of monitoring units (e.g., one monitoring unit for each load), which collectively monitor and/or predict power demands and/or adjust one or more connections between the sources and the loads.

According to various embodiments, monitoring unit 104 may be coupled to one or more loads (e.g., statically or dynamically), and monitoring unit 104 may include one or more components dedicated to a single load and/or one or more components that are shared amongst more than one load.

Figure 2A:
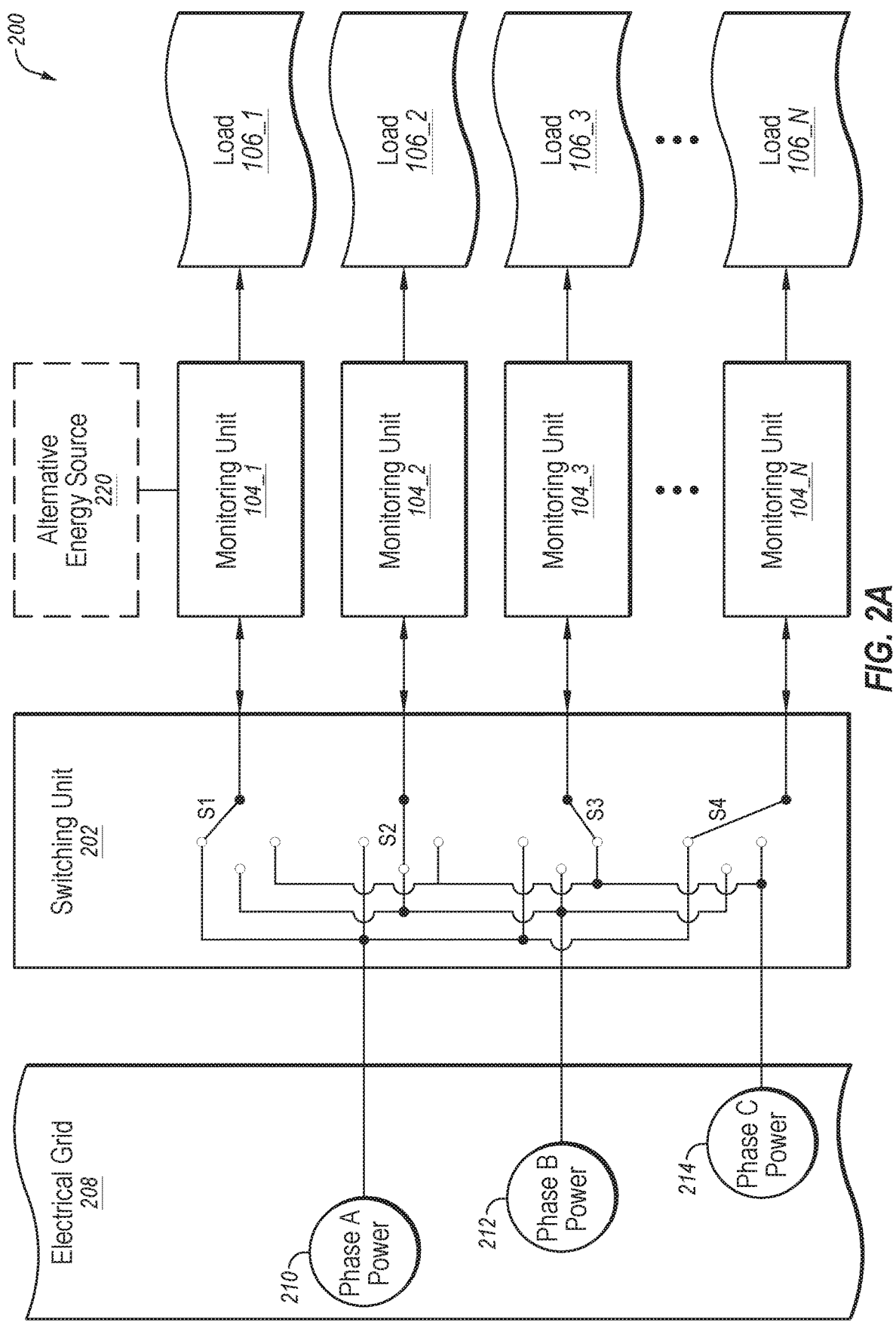
FIG. 2A is a more detailed illustration of an example power distribution system.

FIG. 2A is a more detailed illustration of an example power distribution system 200, in accordance with one or more embodiments of the present disclosure. For example, power distribution system 100 of FIG. 1 may include power distribution system 200 of FIG. 2A.

Power distribution system 200 includes a switching unit 202, monitoring units 104_1-1-4_N, and loads 106_1-1-6_N. Further, in at least some embodiments, switching unit 202 may be coupled to an electrical grid 208. Electrical grid 208, which may include electrical grid 108 (see FIG. 1), may generate a plurality of phases (e.g., of AC power). For example, electrical grid 208 may generate power at a first phase (e.g., phase A) via a first source 210, power at a second phase (e.g., phase B) via a second source 212, and power at a third phase (e.g., phase C) via a third source 214. According to at least one non-limiting example, in a three-phase power distribution system, each source may convey power at the same or similar amplitude, and each of the phases may be offset from the other phases (e.g., by approximately 120 degrees). Further, in a three-phase power distribution system, one of the three phases may be at or near a maximum amplitude at any given time.

Although various embodiments described herein reference a three-phase power distribution system, other phase offsets are contemplated. For example, in a two-phase power distribution system, the phases may be offset by approximately 180 degrees, and in a four-phase power distribution system, the phases may be offset by approximately 90 degrees.

Switching unit 202 may include a plurality of switches S1-S4, wherein each switch is configured for selectively coupling an associated monitoring unit 104 and associated load 106 to a source. For example, as illustrated in FIG. 2A, switch S1 is configured such that monitoring unit 104_1 and load 106_1 are coupled to source 210, switch S2 is configured such that monitoring unit 104_2 and load 106_2 are coupled to source 212, switch S3 is configured such that monitoring unit 104_3 and load 106_3 are coupled to source 214, and switch S4 is configured such that monitoring unit 104_N and load 106_N are coupled to source 210.

Switches of switching unit 202 may be selectively configured such that any one or more monitoring units 104 may be coupled to any source. For example, switches S1-S4 may be configured such that monitoring units 104_1 and 104_2 and associated loads 106_1 and 106_2 are coupled to source 210, monitoring unit 104_3 and associated load 106_3 are coupled to source 212, and monitoring unit 104_N and associated load 106_N are coupled to source 214. As another example, switches S1-S4 may be configured such that monitoring units 104_3 and 104_N and associated loads 106_3 and 106_N are coupled to source 212, monitoring unit 104_1 and associated load 106_1 are coupled to source 214, and monitoring unit 104_2 and associated load 106_2 are coupled to source 210.

An electrical load (e.g., loads 106_1-106_N) may vary based on numerous factors, such as a number of consumers, a time of day, a time of year, weather, etc. According to various embodiments of the present disclosure, each load of power distribution system 200 (e.g., loads 106_1-load 106_N) may be associated with one or more items or units (e.g., structures (e.g., campus buildings, apartment buildings, homes on a street), floors of an apartment, units of an apartment, servers of a server farm, etc.). In some embodiments, loads may be associated with one or more items (or units) based on predicted power consumption of the items/units.

More specifically, for example, in a campus environment (e.g., a business or school) having five buildings, a first load (e.g., load 106_1) may be associated with two buildings on the campus, a second load (e.g., load 106_2) may be associated with another building on the campus, a third load (e.g., load 106_2) may be associated with another building on the campus, and a fourth load (e.g., load 106_N) may be associated with another building on the campus. In this example, the predicted power consumption of the two buildings associated with the first load may be lower than the predicted power consumption of the buildings associated with the other loads.

In another example, in a neighborhood, a first load (e.g., load 106_1) may be associated with houses on a first street in the neighborhood, a second load (e.g., load 106_2) may be associated with houses on a second street in the neighborhood, a third load (e.g., load 106_3) may be associated with houses on a fourth street in the neighborhood, and a fourth load (e.g., load 106_N) may be associated with houses on a fifth street and a sixth street in the neighborhood. In this example, the predicted power consumption of the houses associated with the fourth load (e.g., houses on the fifth and sixth street) may be lower than the predicted power consumption of the houses on the streets associated with the other loads.

In yet another example, for an apartment complex having a plurality of apartment units (e.g., 30 units), a first load (e.g., load 106_1) may be associated with a first group of apartments of the apartment complex (e.g., apartments 1-10), a second load (e.g., load 106_2) may be associated with a second group of apartments of the apartment complex (e.g., apartments 11-15), a third load (e.g., load 106_2) may be associated with a third group of apartments of the apartment complex (e.g., apartments 16-25), and a fourth load (e.g., load 106_N) may be associated with a fourth group of apartments of the apartment complex (e.g., apartments 25-30). In this example, the predicted power consumption of the apartments associated with the second load and the apartments associated with the fourth load may be higher than the predicted power consumption of the apartments associated with the first load and the apartments associated with the third load.

With reference again to FIG. 2A, monitoring units 104, which may include one or more processors (e.g., processor 410 of FIG. 4) and/or memory (e.g., memory 430 of FIG. 4), may be configured to determine and/or monitor an amount of power consumed by an associated load. Further, monitoring units 104 may be configured to predict an amount of power to be consumed by an associated load (e.g., based on historical data, time of day, time of year, weather, etc.). Moreover, in response to, for example, a detected change in the power demand of one or more loads 106 and/or a predicted change in the power demand of one or more loads 106, one or more of monitoring units 104 may cause switching unit 202 to be adjusted (e.g., via switching a configuration of one or more of switches S1-S4) (e.g., to more evenly distribute a total load across system 200 (e.g., across the phases supplied by sources 210, 212, and 214)). For example, if the load across all phases (e.g., phases supplied by sources 210, 212, and 214) is even, a neutral current may be zero, which may be desirable.

As noted above, a power distribution system may include a plurality of monitoring units, wherein one monitoring unit may function as a master monitoring unit. For example, with reference to FIG. 2A, one monitoring unit (e.g., monitoring unit 104_1) may be configured to function as the master monitoring unit, and the other monitoring units (e.g., monitoring units 104_2-104_N) may be configured as slave monitoring units (also referred to herein as "metering units"). In this embodiment, the master monitoring unit may include a processor and/or memory, and the slave monitoring unit may or may not include a processor and/or memory. Further, in this, embodiment, the slave monitoring units may provide data (e.g., current power consumption and/or past power consumption) related to associated loads to the master monitoring unit. Further, based on data associated with each load, the master monitoring unit may detect and/or predict a change in power consumption of one or more loads, and, in response thereto, dynamically adjust one or more connections between the sources and the loads.

In other embodiments, each monitoring unit 104 may include a processor (and possibly memory) and the monitoring units may collectively monitor and/or adjust a configuration of switching unit 202 (e.g., to more evenly distribute the total load across system 200 (e.g., across the phases supplied by sources 210, 212, 214)).

Figure 2B:
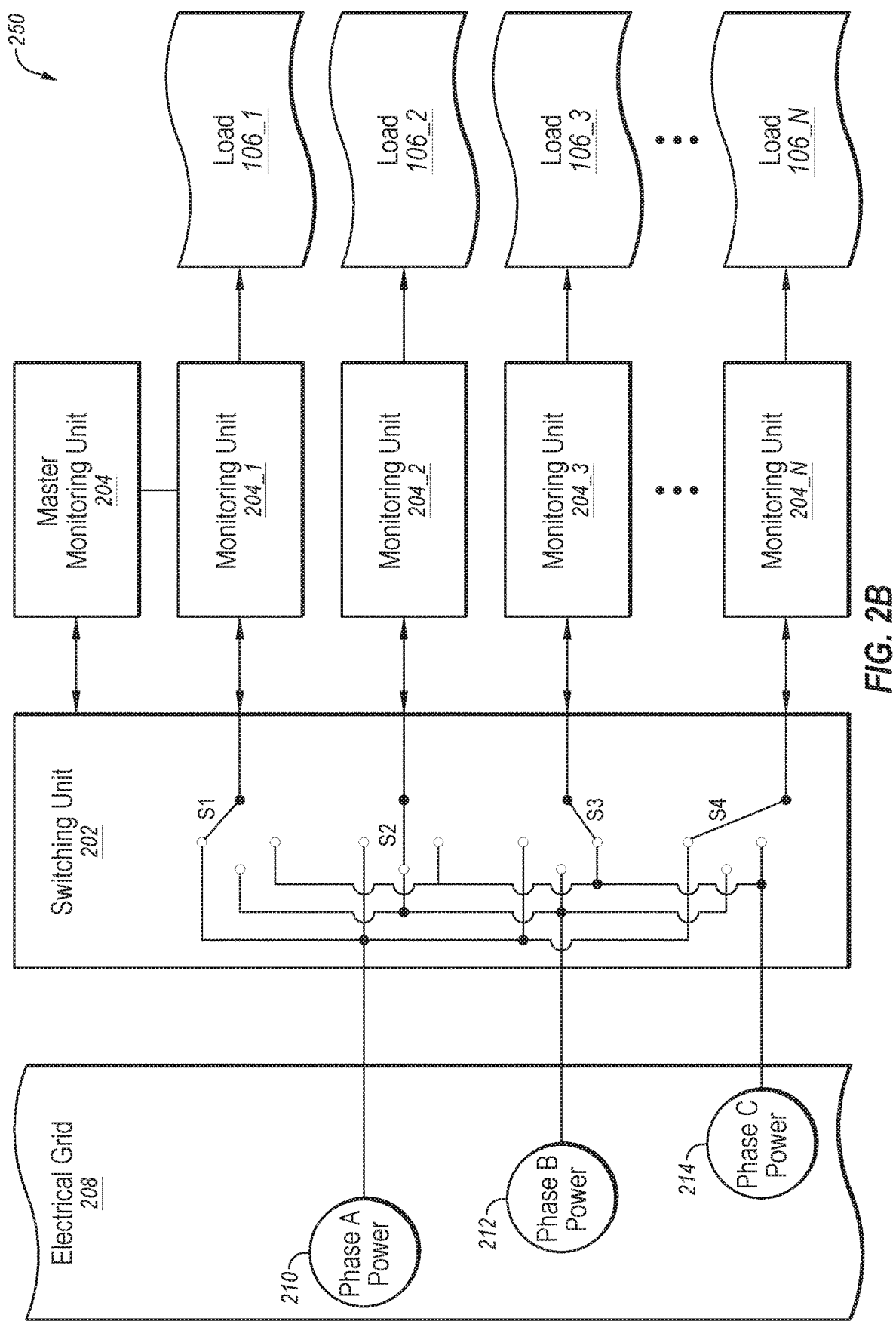
FIG. 2B depicts another example power distribution system.

Further, in other embodiments, a power distribution system may include a master monitoring unit and one or more metering units (also referred to herein as "slave monitoring units"). For example, FIG. 2B depicts another example power distribution system 250 including a master monitoring unit 204 and slave monitoring units 204_1-204_N. In this embodiment, master monitoring unit 204, which may include one or more processors and/or memory, may be configured to monitor and/or adjust a configuration of switching unit 202 (e.g., via one or more switches) to more evenly distribute a total load across system 200 (e.g., across the phases supplied by sources 210, 212, 214). In this embodiment, slave monitoring units 204_1-204_N may or may not include a processor and/or memory.

According to various embodiments, one or monitoring units may factor in both detected changes and predicted changes to power consumption when configuring switching unit 202. Further, in some embodiments, a detected change in power consumption may take priority over a predicted change in power consumption. In other embodiments, a predicted change in power consumption may take priority over a detected change in power consumption.

For example, monitoring unit 104_1 may monitor an amount of power being consumed (a "current power demand") by associated load 106_1 and may cause switching unit 202 to be adjusted (e.g., via switching one or more of switches) in response to a change in power consumption of associated load 106_1 or another load (e.g., load 106_2, load 106_2, and/or load 106_N). Alternatively, or additionally, monitoring unit 104_1 may cause switching unit 202 to be adjusted based on a predicted amount of power to be consumed (a "predicted power demand") by associated load 106_1 or another load (e.g., load 106_2, load 106_2, and/or load 106_N). For example, monitoring unit 104_1 may predict an amount of power to be consumed by load 106_1, and/or any other load, based on historical data (e.g., an amount of power consumed by load 106_1 during a time period (e.g., during the previous year, month, week, day, etc.)), weather, time of year, time of day and/or any other data that may be used to predict an amount of power likely to be consumed by load 106_1 and/or any other load.

In one example, provided for explanation purposes only, a multistructure environment (e.g., a campus) may include switching unit 202, at least one monitoring unit 104, and loads 106. Further, in this example, load 106_1 may be associated with buildings 1-3 of the campus, load 106_2 may be associated with buildings 4-6 of the campus, load 106_3 may be associated with buildings 6-9 of the campus, and load 106_N may be associated with buildings 10-12 of the campus. In one example, buildings 1-6 may be consuming, or have historically consumed, relatively low amounts of power, and buildings 7-12 may be consuming, or have historically consumed, relatively high amounts of power.

Continuing with this example, based on current power consumption and/or predicted power consumption of load 106_1 and load 106_2 (e.g., buildings 1-6), system 200 may be configured such that each of load 106_1 and load 106_2 are coupled to source 210. Further, based on current power consumption and/or predicted power consumption of load 106_3 (e.g., buildings 7-9) and load 106_4 (e.g., buildings 10-12), system 200 may be configured such that load 106_3 is coupled to source 212 and load 106_4 is coupled to source 214.

Further, at any time, switching unit 202 may be modified (e.g., via modifying the configuration of one or more switches) in response to a detected and/or predicted change in a power demand or one or more loads, a change in the time (e.g., daytime versus nighttime, weekdays versus weekend, etc.), a change in weather, etc.

For example, in the event power consumption of buildings 1-3 increases (e.g., and thus the demand of load 106_1 increases), load 106_2 may be switched from source 210 to source 212. In another example, based on a predicted decrease of power consumption of buildings 6-12, load 106_3 may be switched from source 212 to source 214.

In another example relating to a multitenant apartment complex, system 200 may detect and/or predict that floors 1-3 of the complex use less power during a first time period (e.g., daytime) compared to a second, different time period (e.g., nighttime). Further, in this example, system 200 may detect and/or predict that floors 4-6 of the complex use more power during the first time period (e.g., daytime) compared to the second time period (e.g., nighttime). Continuing with this example, system 200 may further detect and/or predict that floors 7-9 of the complex use a relatively low amount of power regardless of the time of day, and floors 10-12 of the complex use a relatively high amount of power regardless of the time of day. Therefore, in this example, at all times (e.g., day or night), system 200 may be configured such that source 210 provides power to only load 106_N, which is associated with floors 10-12. Further, during the first time period (e.g., daytime hours), a source (e.g., source 212) supplies power to load 106_1 and load 106_3 (e.g., floors 1-3 and 7-9), and another source (e.g., source 214) supplies power to load 106_2 (e.g., floors 4-6). Moreover, during the second time period (e.g., nighttime hours), a source (e.g., source 212) supplies power to load 106_2 and load 106_3 (e.g., floors 4-9), and another source (e.g., source 210) supplies power to load 106_1 (e.g., floors 1-3).

Thus, according to various embodiments, based on, for example, power demands (e.g., current and/or predicted power demands) of one or more loads, sources (e.g., each source 210, 212, and 214) may be selectively and dynamically coupled to at least one load. Dynamically coupling sources to loads (e.g., based on detected and/or predicted demands) may provide improved load balancing of a multiphase power distribution system.

In some embodiments, system 200 may include one or more alternative energy sources (AES) 220, such as, photovoltaic (PV) solar power, wind power, geothermal power, battery, etc. AES 220 may also be referred to herein as a "non-grid power source." In these embodiments, system 200, and more specifically, one or more monitoring units 104, may determine and/or predict an amount of power generated via AES 220, and use this information in configuring switching unit 202.

Figure 2C:
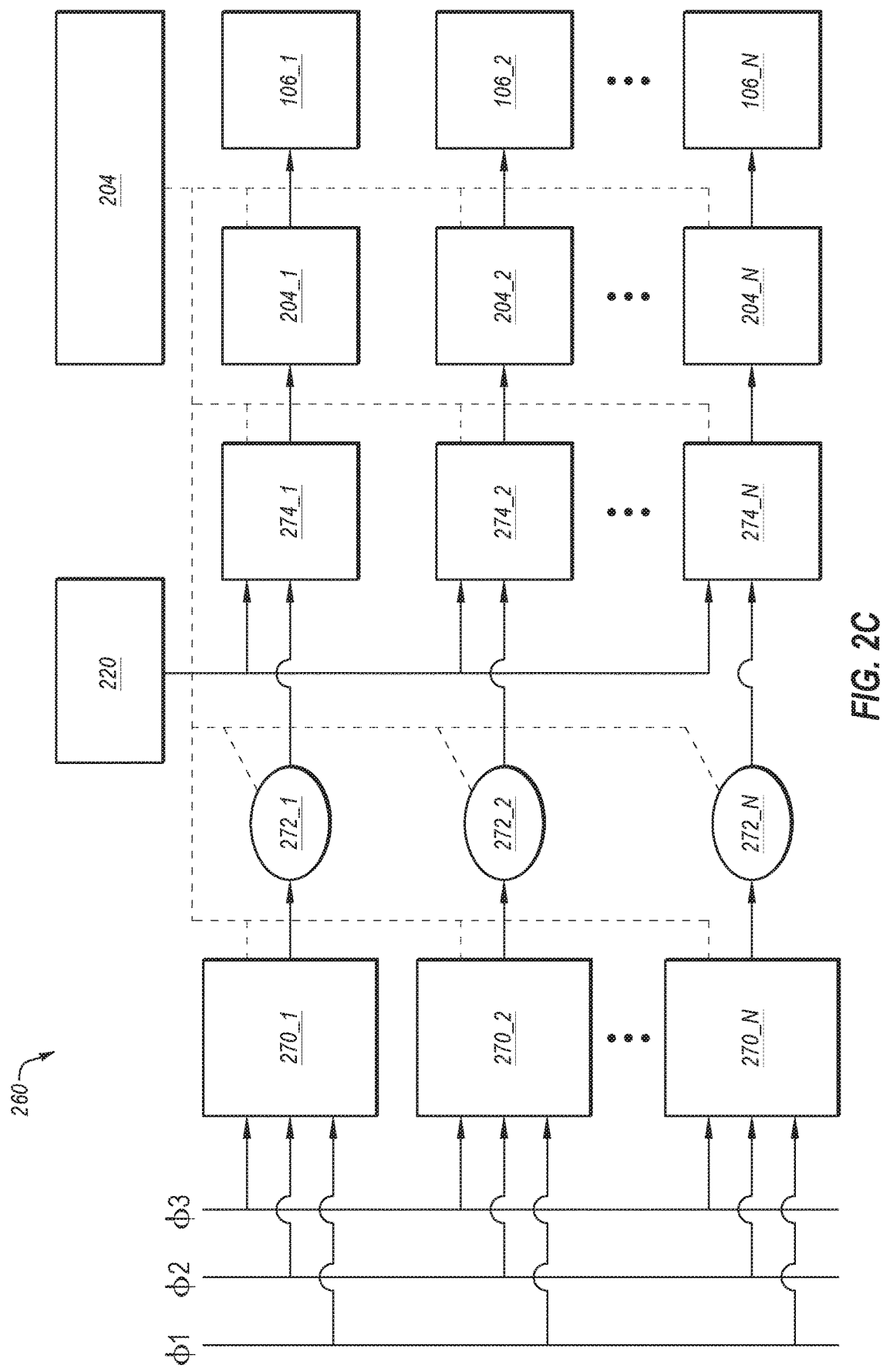
FIG. 2C depicts yet another example power distribution system.

FIG. 2C illustrates another example power distribution system 260, in accordance with one or more embodiments of the present disclosure. Power distribution system 260 includes AES 220, master monitoring unit 204, slave monitoring units 204_1-204_N, and loads 106_1-106_N._N. Further, in at least this embodiment, power distribution system 260 includes switches 270_1-270_N, sensors 272_1-272_N, and switches 274_1-274_N.

For example, switches 270_1-270_N may each include a single throw triple pole switch, or any other suitable switch, for selectively coupling an associated sensor to a phase of power (e.g., phase $\Phi_1$, phase $\Phi_2$, or phase $\Phi_3$). Further, for example, switches 274_1-274_N may each include a single throw double pole switch, or any suitable other switch, for selective coupling an associated slave monitoring unit to either an associated sensor or AES 220. Moreover, for example, each of sensors 272_1-272_N may include a current sensor configured to sense an amount of current convey via an associated switch. In some embodiments, sensors 272_1-272_N may each be configured to sense power, voltage, current, phase, power factor, or any combination thereof.

According to various embodiments, master monitoring unit 204 may be configured to receive status signals from each of slave monitoring units 204_1-204_N, switches 270_1-270_N, sensors 272_1-272_N, and switches 274_1-274_N. Further, master monitoring unit 204 may be configured to convey control signals to each of slave monitoring units 204_1-204_N, switches 270_1-270_N, sensors 272_1-272_N, and switches 274_1-274_N.

During a contemplated operation of system 270, master monitoring unit 204 may configure one or more of switches 270_1-270_N and switches 274_1-274_N (e.g., based on a sensor reading of one or more of sensors 272_1-272_N and/or status data received from one or more of slave monitoring units 204_1-204_N) to improve the load balancing of power distribution system 260.

Figure 3:
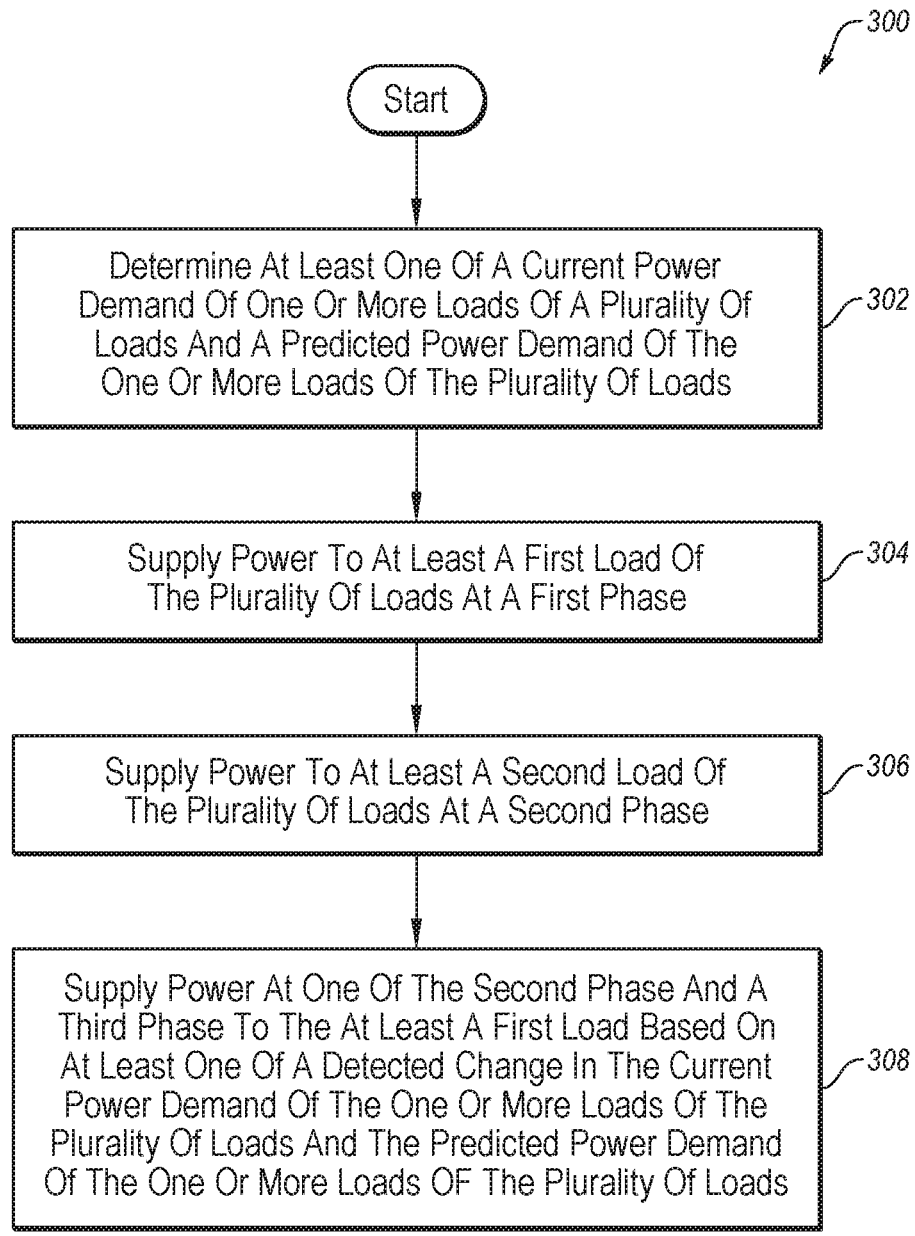
FIG. 3 is a flowchart of an example method of supplying electrical power to a plurality of loads, in accordance with at least one embodiment of the present disclosure.

FIG. 3 is a flowchart of an example method 300 of supplying electrical power to one or more loads, in accordance with at least one embodiment of the present disclosure. Method 300 may be performed by any suitable system, apparatus, or device. For example, system 100, system 200, system 250, device 400, or one or more of the components thereof may perform one or more of the operations associated with method 300. In these and other embodiments, program instructions stored on a computer readable medium may be executed to perform one or more of the operations of method 300.

At block 302, at least one of a current power demand of a plurality of loads and a predicted power demand of the plurality of loads may be determined, and method 300 may proceed to block 304. For example, at least one monitoring unit 104 (see FIG. 2A), and possibly one or more metering units, may determine (e.g., measure) an amount of power being consumed by each load of the plurality of loads. Further, based on various factors, such as historical data for one or more loads, a time of day (e.g., nighttime versus daytime), a time of year (e.g., winter versus summer), weather conditions, etc., the at least one monitoring unit 104 may predict a power demand for one or more loads of the plurality of loads.

At block 304, power at a first phase may be supplied to at least a first load of the plurality of loads, and method 300 may proceed to block 306. More specifically, for example, via configuring one or more switches S1-S4 of switching unit 202 (see FIG. 2A), one or more of loads 106 may be coupled to source 210, which supplies power at the first phase. For example, load 106_1 and load 106_N may be coupled to source 210 (see FIG. 2A).

At block 306, power at a second phase may be supplied to at least a second load of the plurality of loads, and method 300 may proceed to block 308. More specifically, for example, via configuring one or more switches S1-S4 of switching unit 202 (see FIG. 2A), one or more loads 106 may be coupled to source 212, which supplies power at the second phase. For example, load 106_2 may be coupled to source 212 (see FIG. 2A). In at least one embodiment, the first phase and the second phase may be offset by approximately 120 degrees.

At block 308, based on predicted power consumption and/or a detected change in power consumption of at least one load of the plurality of loads, power transmission to one or more loads may be modified. For example, power at the second phase may be supplied to the at least a first load (e.g., load 106_1 and load 106_N) and/or power at the first phase may be supplied to the at least a second load (e.g., load 106_2). Further, power at the second phase and/or power at the first phase may be provided to another load (e.g., at least a third load). Moreover, power at a third phase (e.g., at a phase offset from each of the first phase and the second phase by approximately 120 degrees) may be supplied to one or more loads (e.g., the at least a first load, the at least a second load, and/or another load).

Modifications, additions, or omissions may be made to method 300 without departing from the scope of the present disclosure. For example, the operations of method 300 may be implemented in differing order. Furthermore, the outlined operations and actions are only provided as examples, and some of the operations and actions may be optional, combined into fewer operations and actions, or expanded into additional operations and actions without detracting from the essence of the disclosed embodiments. For example, in an additional act, power at a third phase may be supplied to at least a third load of the plurality of loads. More specifically, for example, via configuring one or more switches S1-S4 of switching unit 202 (see FIG. 2A), one or more of loads 106 may be coupled to source 214, which supplies power at the third phase. For example, load 106_3 may be coupled to source 214 (see FIG. 2A). In at least one embodiment, each of the first phase, second phase, and third phase may be offset by from one another by approximately 120 degrees.

Figure 4:
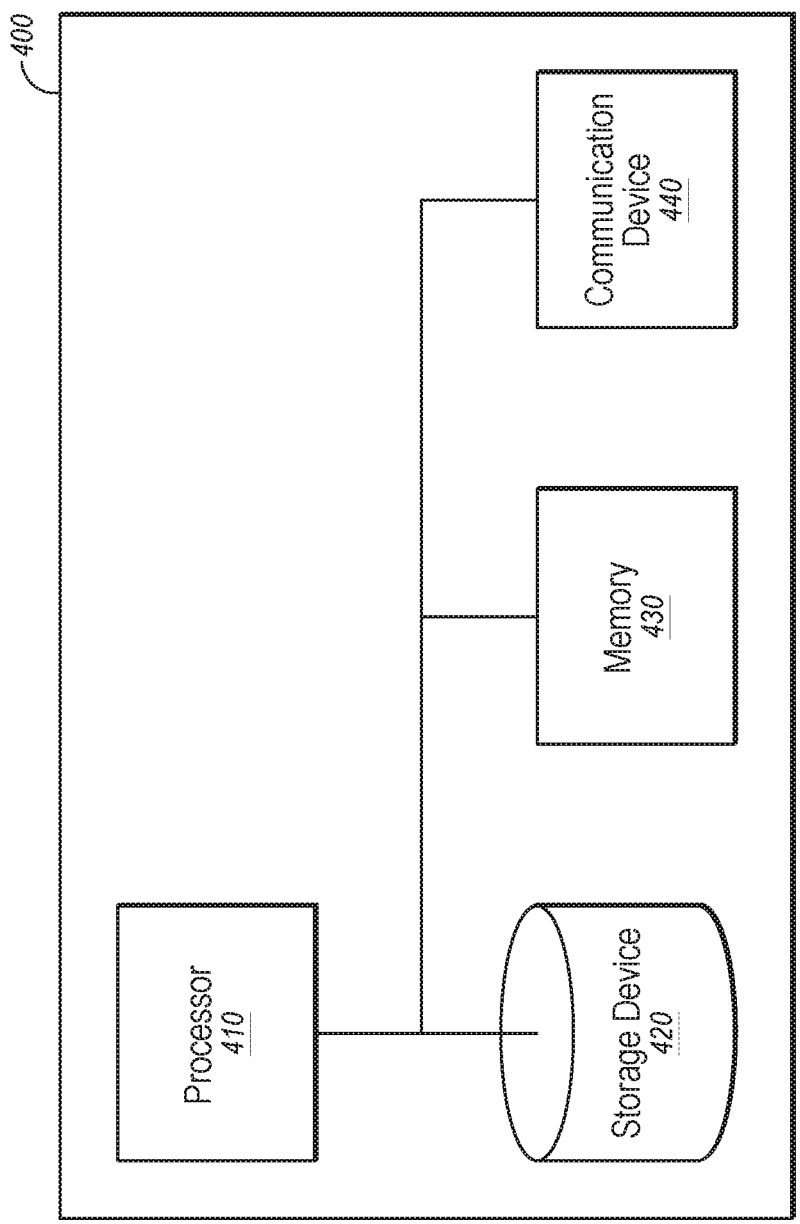
FIG. 4 is a block diagram of an example computing device that may be used in carrying out various embodiments of the present disclosure.

FIG. 4 is a block diagram of an example computing device 400, in accordance with at least one embodiment of the present disclosure. Computing device 400 may include a desktop computer, a laptop computer, a server computer, a tablet computer, a mobile phone, a smartphone, a personal digital assistant (PDA), an e-reader device, a network switch, a network router, a network hub, other networking devices, or other suitable computing device.

Computing device 400 may include a processor 410, a storage device 420, a memory 430, and a communication device 440. Processor 410, storage device 420, memory 430, and/or communication device 440 may all be communicatively coupled such that each of the components may communicate with the other components. Computing device 400 may perform any of the operations described in the present disclosure.

In general, processor 410 may include any suitable special-purpose or general-purpose computer, computing entity, or processing device including various computer hardware or software modules and may be configured to execute instructions stored on any applicable computer-readable storage media. For example, processor 410 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data. Although illustrated as a single processor in FIG. 4, processor 410 may include any number of processors configured to perform, individually or collectively, any number of operations described in the present disclosure.

In some embodiments, processor 410 may interpret and/or execute program instructions and/or process data stored in storage device 420, memory 430, or storage device 420 and memory 430. In some embodiments, processor 410 may fetch program instructions from storage device 420 and load the program instructions in memory 430. After the program instructions are loaded into memory 430, processor 410 may execute the program instructions.

For example, in some embodiments one or more of processing operations for determining, monitoring and/or predicting load power consumption and/or requirements and/or configuring a switching unit (e.g., switching unit 202; see FIG. 2A) may be included in data storage 420 as program instructions. Processor 410 may fetch the program instructions of one or more of the processing operations and may load the program instructions of the processing operations in memory 430. After the program instructions of the processing operations are loaded into memory 430, processor 410 may execute the program instructions such that computing device 400 may implement the operations associated with the processing operations as directed by the program instructions.

Storage device 420 and memory 430 may include computer-readable storage media for carrying or having computer-executable instructions or data structures stored thereon. Such computer-readable storage media may include any available media that may be accessed by a general-purpose or special-purpose computer, such as processor 410. By way of example, and not limitation, such computer-readable storage media may include tangible or non-transitory computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 410 to perform a certain operation or group of operations.

In some embodiments, storage device 420 and/or memory 430 may store data associated with supplying power to one or more loads, and more specifically, data associated with power consumption and/or requirements of a multiphase power distribution system. For example, storage device 420 and/or memory 430 may store current and/or historical data related to power consumption by one or more loads.

Communication device 440 may include any device, system, component, or collection of components configured to allow or facilitate communication between computing device 400 and another electronic device. For example, communication device 440 may include, without limitation, a modem, a network card (wireless or wired), an infrared communication device, an optical communication device, a wireless communication device (such as an antenna), and/or chipset (such as a Bluetooth device, an 802.6 device (e.g. Metropolitan Area Network (MAN)), a Wi-Fi device, a WiMAX device, cellular communication facilities, etc.), and/or the like. Communication device 440 may permit data to be exchanged with any network such as a cellular network, a Wi-Fi network, a MAN, an optical network, etc., to name a few examples, and/or any other devices described in the present disclosure, including remote devices.

Modifications, additions, or omissions may be made to FIG. 4 without departing from the scope of the present disclosure. For example, computing device 400 may include more or fewer elements than those illustrated and described in the present disclosure. For example, computing device 400 may include an integrated display device such as a screen of a tablet or mobile phone or may include an external monitor, a projector, a television, or other suitable display device that may be separate from and communicatively coupled to computing device 400.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In the present disclosure, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A power distribution system, comprising:
    a switching system including a first plurality of switches and a second plurality of switches, the first plurality of switches configured to receive power from a plurality of sources that includes a plurality of grid sources and the second plurality of switches each configured to receive power from a different one of the first plurality of switches and at least one alternative energy source, the switching system configured to selectively couple each load of a plurality of loads to any one of the plurality of sources and each load when coupled to one of the plurality of sources is electrically coupled only to the one of the plurality of sources and electrically isolated from the other of the plurality of sources, wherein each grid source of the plurality of grid sources is configured to supply power at a phase offset from a phase of every other grid source and the at least one alternative energy source includes one or more of: solar power, wind power, and geothermal power;
    a plurality of power sensors, each of the plurality of sensors coupled in series between one of the first plurality of switches and one of the second plurality of switches, the plurality of power sensors configured to determine sensor information including a current level of one or more characteristics of power flowing between the plurality of first switches and the plurality of second switches;
    a plurality of slave monitoring devices, each of the plurality of slave monitoring devices coupled in series between one of the second plurality of switches and one of the plurality of loads, the plurality of slave monitoring devices configured to determine monitor information including a current level of one or more characteristics of power flowing between the plurality of second switches and the plurality of loads; and
    a master monitoring unit configured to:
        select a source of the plurality of sources for each load of the plurality of loads based on the sensor information, the monitor information and at least one of: a predicted amount of power generated by the at least one alternative energy source and a predicted power demand of the plurality of loads, and
        direct the switching system to selectively couple each load of the plurality of loads to the selected source of the plurality of sources.

2. The power distribution system of claim 1, further comprising an electrical grid including the plurality of sources, wherein each grid source of the plurality of grid sources is configured to supply power 120 degrees out of phase with power supplied from other grid sources of the plurality of grid sources.

3. The power distribution system of claim 1, wherein the master monitoring unit is configured to
    predict an amount of power to be consumed by each load of the plurality of loads.

4. A method of supplying electrical power to loads, comprising:
    selectively coupling power at a first phase to a first load of a plurality of loads such that the first load is electrically coupled only to the first phase and electrically isolated from a second phase of the power, a third phase of the power, and at least one alternative energy source, the selectively coupling the power at the first phase performed by a first plurality of switches coupled to the first, second, and third phases of the power and a second plurality of switches coupled to the at least one alternative energy source and in series between the first load and the first plurality of switches;
    selectively coupling power at a second phase, offset from the first phase, to a second load of the plurality of loads such that the second load is electrically coupled only to the second phase and electrically isolated from the first phase of the power, the third phase of the power, which is offset from each of the first phase and the second phase, and the at least one alternative energy source, the selectively coupling the power at the second phase performed by the first plurality of switches and the second plurality of switches;

obtaining sensor information including a current level of one or more characteristics of power flowing between the plurality of first switches and the plurality of second switches from one or more of a plurality of sensors coupled in series between the first plurality of switches and the second plurality of switches;

obtain monitor information including a current level of one or more characteristics of power flowing between the plurality of second switches and the first load and the second load from one or more of a plurality of slave monitoring devices coupled in series between the second plurality of switches and the first and second loads; and selectively coupling power at the second phase, power at the third phase, or power from the at least one alternative energy source, to the first load via the first plurality of switches and the second plurality of switches based on a determination by a master monitoring device coupled to the plurality of sensors and the plurality of slave monitoring devices, the master monitoring device making the determination based on the sensor information, the monitor information and at least one of: a predicted amount of power generated by the at least one alternative energy source and a predicted power demand of the one or more loads.

5. The method of claim 4, further comprising selectively coupling power at the third phase to a third load of the plurality of loads such that the third load is electrically coupled only to the third phase and electrically isolated from the first phase of the power, the second phase of the power, and the at least one alternative energy source.

6. The method of claim 4, wherein selectively coupling power at the second phase, power at the third phase, or power from the at least one alternative energy source comprises selectively coupling, via the first plurality of switches and the second plurality of switches, the first load to either the second source supplying power at the second phase, a third source supplying power at the third phase, or the at least one alternative energy source.

7. The method of claim 4, wherein determining the predicted power demand comprises predicting a power demand of the plurality of loads based on at least one of historical data for one or more of the plurality of loads, a time of day, a time of year, and weather conditions.

8. A non-transitory computer-readable media having computer instructions stored thereon that, in response to being executed by a processing device of a system, cause the system to perform or control performance of operations comprising:

selectively coupling power at a first phase to a first load of a plurality of loads such that the first load is electrically coupled only to the first phase and electrically isolated from a second phase of the power, a third phase of the power, and at least one alternative energy source, the selectively coupling the power at the first phase performed by a first plurality of switches coupled to the first, second, and third phases of the power and a second plurality of switches coupled to the at least one alternative energy source and in series between the first load and the first plurality of switches;

selectively coupling power at a second phase, offset from the first phase, to a second load of the plurality of loads such that the second load is electrically coupled only to the second phase and electrically isolated from the first phase of the power, the third phase of the power, which is offset from each of the first phase and the second phase, and the at least one alternative energy source, the selectively coupling the power at the second phase performed by the first plurality of switches and the second plurality of switches;

obtaining sensor information including a current level of one or more characteristics of power flowing between the plurality of first switches and the plurality of second switches from one or more of a plurality of sensors coupled in series between the first plurality of switches and the second plurality of switches;

obtain monitor information including a current level of one or more characteristics of power flowing between the plurality of second switches and the first load and the second load from one or more of a plurality of slave monitoring devices coupled in series between the second plurality of switches and the first and second loads; and selectively coupling power at the second phase, power at the third phase, or power from the at least one alternative energy source, to the first load via the first plurality of switches and the second plurality of switches based on a determination by a master monitoring device coupled to the plurality of sensors and the plurality of slave monitoring devices, the master monitoring device making the determination based on the sensor information, the monitor information and at least one of: a predicted amount of power generated by the at least one alternative energy source and a predicted power demand of the one or more loads.

9. The non-transitory computer-readable media of claim 8, the operations further comprising selectively coupling power at the third phase to a third load of the plurality of loads such that the third load is electrically coupled only to the third phase and electrically isolated from the first phase of the power, the second phase of the power, and the at least one alternative energy source.

10. The non-transitory computer-readable media of claim 8, wherein selectively coupling power at the second phase, power at the third phase, or power from the at least one alternative energy source comprises selectively coupling, via the first plurality of switches and the second plurality of switches, the first load to either the second source supplying power at the second phase, a third source supplying power at the third phase or the at least one alternative energy source.

* * * * *